TRACKING AUTOMATIC GAIN CONTROL CIRCUIT

Filed Aug. 26, 1964 2 Sheets-Sheet 1

CRILEY ORTON
INVENTOR.
BY F. M. Phillips
J. M. St. Amand
ATTORNEYS

Oct. 17, 1967 C. ORTON 3,348,115

TRACKING AUTOMATIC GAIN CONTROL CIRCUIT

Filed Aug. 26, 1964 2 Sheets-Sheet 2

CRILEY ORTON
INVENTOR.

BY T. M. Phillips
J. M. St. Amand
ATTORNEYS

United States Patent Office 3,348,115

Patented Oct. 17, 1967

3,348,115
TRACKING AUTOMATIC GAIN CONTROL CIRCUIT

Criley Orton, Arlington, Calif., assignor to the United States of America as represented by the Secretary of the Navy Filed Aug. 26, 1964, Ser. No. 392,351
3 Claims. (Cl. 320—1)

ABSTRACT OF THE DISCLOSURE

A circuit that provides fast response automatic control of the gain of an input frequency regardless of its pulse repetition frequency, direction of signal power change or signal power level within the frequency dynamic range by memorizing the received power level and holding for use as automatic gain control until another signal arrives. A shaped feedback voltage to the memory gate varies the charge rate of the memory circuit to control the gain control characteristics.

The invention herein described may be manufactured and used by or for the Government of the United States of America for governmental purposes without the payment of any royalties thereon or therefor.

The present invention relates to tracking automatic gain control and more particularly to a tracking automatic gain control which is independent of pulse-repetition-frequency (PRF), sense of power variation and has a rapid pulse-to-pulse response.

The conventional method of producing automatic gain control of intermediate amplifiers is to detect and filter the absolute power level of the amplifier output. A small change in the output power level is used to produce a large change in gain of the amplifier. For slowly changing power levels of the input signal, a filter with a long time constant is adequate to hold the output power to close tolerances. A continuous wave or broadcast signal in particular poses no problem. When the input consists of a pulse train, the stretched video pulse D-C value becomes a function of the PRF as well as the power level, increasing in magnitude with an increase in PRF, and the nominal value of the pulse is not held. If the pulse is boxcarred, the average D-C value is not greatly changed with a change in PRF since a nearly continuous signal is produced. A problem exists, however, in that if the time constant of the filters is held constant and the PRF changed, the pulse-to-pulse change in the developed AGC is in inverse proportion to the PRF. As the PRF is lowered, the boxcar has a longer period of time in which to charge the AGC circuit, and a condition of closed loop having a gain greater than one occurs, causing oscillation of the system. The gain can be reduced to less than one for the lowest PRF used but then the pulse-to-pulse response for the higher PRF is slow. If, for example, the response of the AGC system is ten db per pulse at a low PRF, it is only one db per pulse at a PRF ten times as great.

A second disadvantage of conventional AGC systems is the differential gains of the IF amplifier as seen through the AGC input, which are a function of the absolute power of the signal that produces the AGC voltage. Maximum loop gain occurs with the strongest signals. To keep the AGC loop gain less than one at all power levels, it must be adjusted for unity gain with the strongest signal expected.

Another disadvantage is that the AGC is developed linearly from voltage differences with respect to nominal pulse voltage whereas AGC action produces a logarithmic action in pulse amplitude change. As an example, consider a nominal pulse amplitude associated with a particular value of AGC. A change of AGC voltage which doubles the pulse amplitude produces a difference which is equal in value to the nominal value. Decreasing the AGC by an equal amount from the nominal value only lowers the value of the pulse amplitude by one-half, giving a difference of one-half the nominal value, even though the IF amplifier gain was changed approximately 6 db in either case. The result of this situation is that the response of the AGC system is slower for signals whose amplitudes are below nominal than for those above.

An object of the present invention is to provide an automatic gain control circuit which overcomes the above disadvantages of conventional AGC systems, i.e., sensitive to frequency, sensitive to power and sensitive to the direction of power change of the signal.

Another object of the invention is the provision of an automatic gain control circuit which is insensitive to frequency by providing a memory stage which generates an AGC voltage that is constant for the longest PRF period used.

A further object is to provide an automatic gain control circuit that is insensitive to signal power by decreasing the memory stage pulse-to-pulse voltage changes as the signal power increases to decrease the AGC gain as the input signal incremental gain increases which results in a loop gain of one at all signal power levels within the IF amplifier range.

Still another object is to provide an automatic gain control circuit that is insensitive to direction of signal power change by providing separate charging circuits for charging the memory stage voltage in either a positive or negative direction with means for varying the charging rate of the lower amplitude negative-going signal.

Other objects and many of the attendant advantages of this invention will become readily appreciated as the same becomes better understood by reference to the following detailed description when considered in connection with the accompanying drawings wherein.

Figure 1:
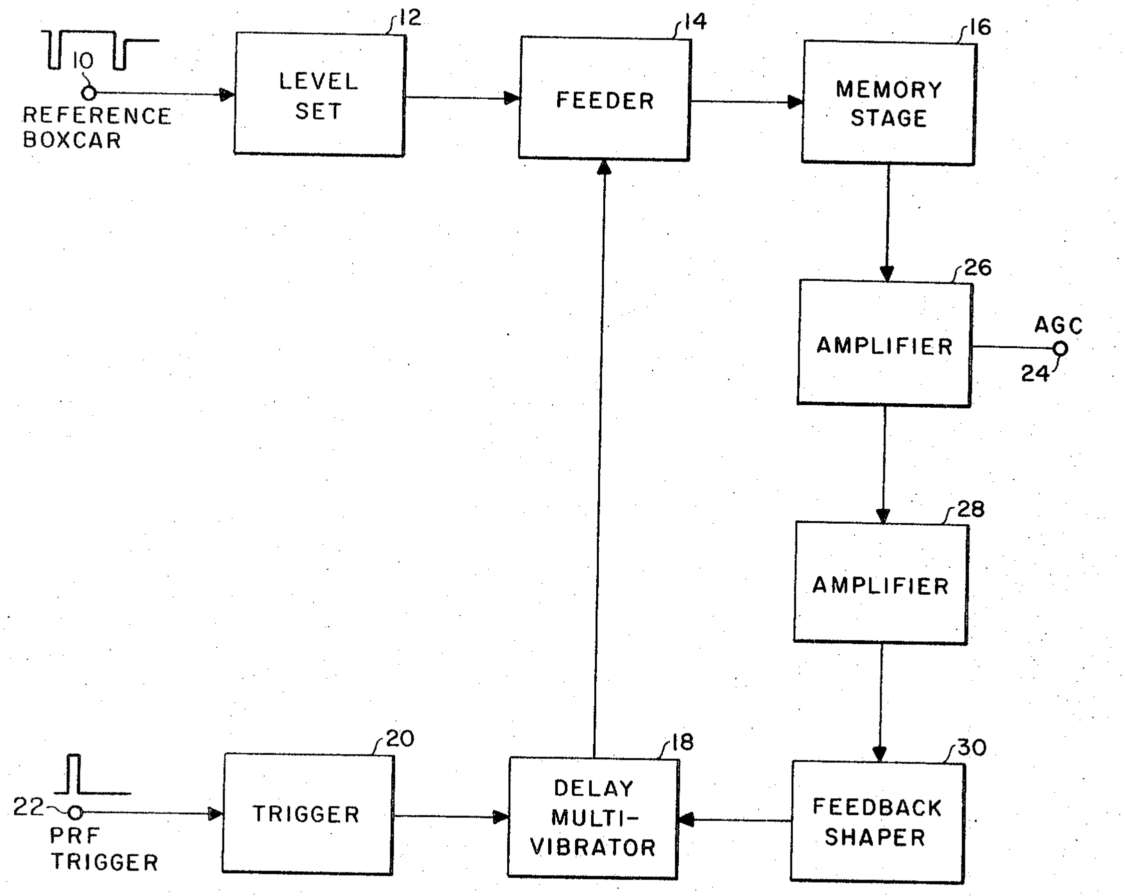
FIG. 1 shows a block diagram of a preferred embodiment of the invention.

Referring now to the drawings there is shown in FIG. 1 an input terminal 10 for receiving a portion of the output signal from an intermediate frequency pulse amplifier (not shown). The signal has been stretched or boxcar detected. The signal received at terminal 10 is adjusted by level set 12 so that the desired nominal received signal coincides with ground potential. Changes in the value of the input signal are fed through a dual circuit feeder 14 to the memory stage 16. Electrons are added to memory stage 16 when the value of the input signal at the output of level set 12 is below ground potential and subtracted when the signal is above ground potential.

Feeder 14 is gated by a gating pulse from delay multivibrator 18 which is triggered by a pulse from trigger pulse generator 20 which has a pulse generated at the PRF by excitation of the PRF trigger received at terminal 22. The AGC signal appears at terminal 24 where it has been amplified in amplifier 26 to provide the necessary gain. A portion of the AGC signal is amplified in amplifier 28 to provide additional gain to drive feedback shaping network 30 which adjust the gate width at the output of delay multivibrator 18.

Figure 2:
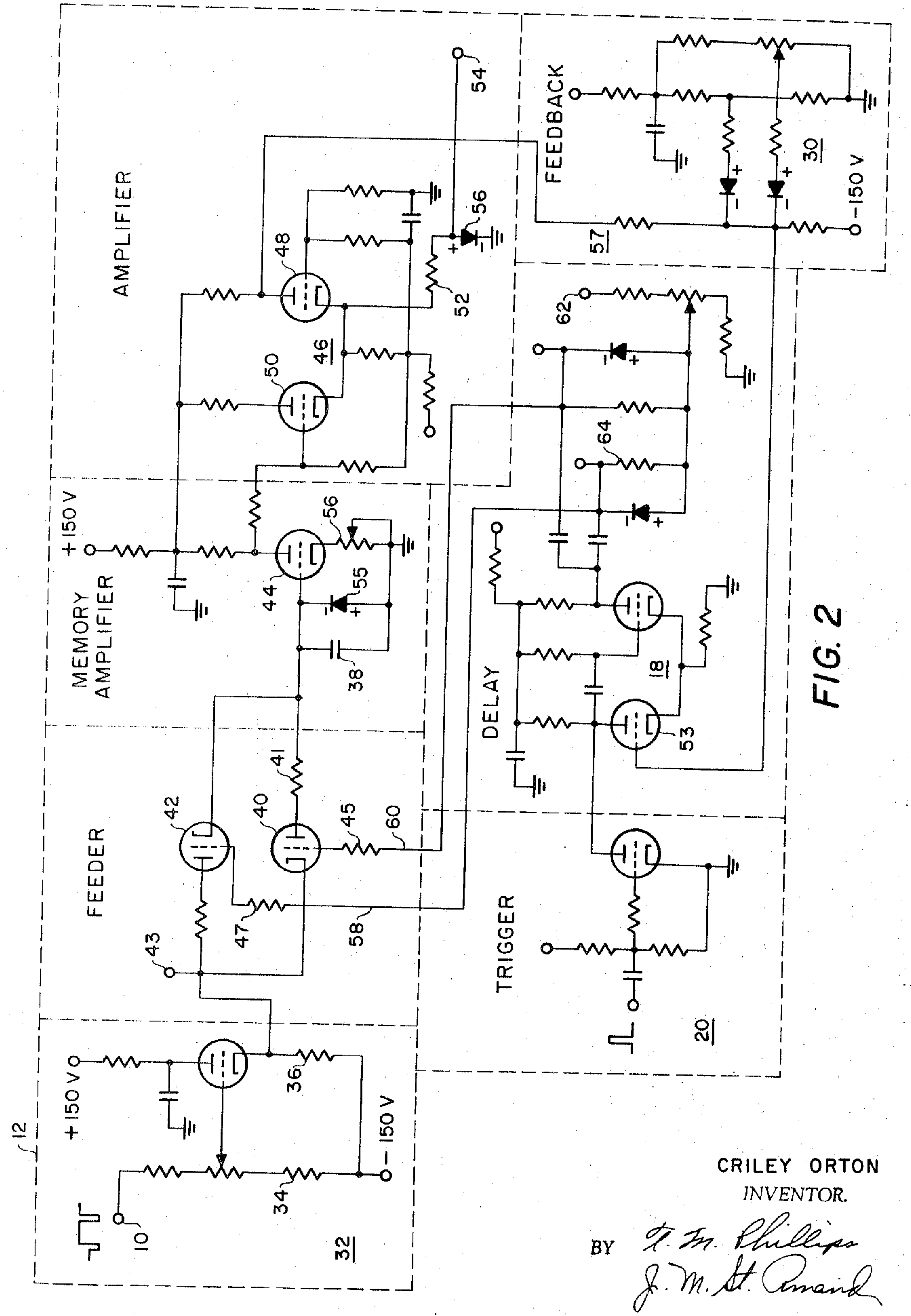
FIG. 2 shows a schematic diagram of the embodiment of FIG. 1.

For a more complete descripition of the operation of the device, reference is now made to FIG. 2. Adjustment of the level of the input signal at terminal 10 is accomplished by means of a variable tap potential divider 32 with the variable tap 34 coupled to the grid of cathode follower tube 36. The signal from tube 36 is fed through a dual path feeder circuit 14 to memory capacitor 38.

Feeder circuit 14 consists of two triodes 40 and 42 connected in parallel. Capacitor 38 is connected to the grid of a triode amplifier stage 44. The amplified output from amplifier 44 drives a difference type amplifier 46 which comprises triodes 48 and 50. The cathode voltage of tube 48 is the AGC output which passes through a voltage limiting resistor 52 and appears at terminal 54. Diode 56 is connected across the output to prevent possible damage to circuit components caused by polarity reversal while adjusting the zero level cathode resistor 56 of tube 44.

The charge applied to memory capacitor 38 is controlled by delay multivibrator 18 which is triggered by signals from trigger generator 20. One output from multivibrator 18 is connected to the control grid of feeder tube 42 by lead 58 and a second output is connected to the control grid of feeder tube 42 by lead 58 and a second output is connected to the control grid of feeder tube 40 by lead 60. A feedback signal is coupled from the plate of amplifier tube 48 through a shaping circuit 30 to the control grid tube 53 of the multivibrator circuit for controlling the output pulse width.

In order to make the operation of the device more easily understood, selected sample values are used throughout the described operation. Terminal 10 receives a signal from an IF amplifier through a boxcar circuit (not shown). The level of the received signal is adjusted with variable tap 34 so that the value corresponding to a video voltage of twelve volts represents ground potential. Input signal values corresponding to less than twelve volts of video signal are then negative, while those greater than twelve volts are positive. Multivibrator 18 is turned on for fifty μsec. each time its threshold circuit is triggered, and a small charge is passed from terminal 10 to memory circuit 16. The polarity of the charge depends on the sign of the input signal while the magnitude depends on the absolute value of the input signal and the time tubes 40 and 42 are gated open. This charge, and the corresponding change of voltage on capacitor 38, is held until the next gate arrives. The small change in voltage on capacitor 38 is amplified and is a change in the automatic gain control signal that appears at output terminal 54. Diode 55 prevents capacitor 38 from going more negative than a value of about −0.3 volt which is the reference voltage that corresponds to zero volts AGC after amplification. The time constant of charging resistors 41 and 43 and memory capacitor 38 should be about 3,000 μsec. The input signal voltage at the cathode of tube 36 should have a maximum value of +55 volts and a minimum value of about −20 volts. The grids of feeder triodes 40 and 42 are biased at −40 volts so that both tubes are cut off regardless of the value of the input signal voltage or capacitor 38 voltage. When a PRF trigger pulse from trigger 20 turn on multivibrator 18, a positive pulse of 10 to 50 μsec. duration is applied to each of the grids of feeder triodes 40 and 42 through grid limiting resistors 45 and 47. Gate bias potentiometer 57 is adjusted so that the positive peak voltages at the cathodes of rectifiers 62 and 64 respectively are about +12 volts to limit the current flow in triodes 40 and 42 grid circuits.

The AGC is made independent of absolute power level by means of the combination of the variable width multivibrator 18 and the feedback shaping network 30. The amplified AGC from the plate of tube 48 goes more negative as the signal power increases, and when applied to the multivibrator grid 53 it reduces the multivibrator pulse width. At a particular signal strength, which produces a particular AGC value, the pulse width output from multivibrator 18 must be a unique value to produce a loop gain of one. At each possible value of signal strength input and AGC output the multivibrator pulse width must be such as to produce a loop gain of one. The amplified AGC, when fed directly to the multivibrator grid 53, does not produce this condition. It becomes necessary to reduce the rate of change of the AGC at high signal power levels and feedback shaping network 30 performs this function. At low signal strength the amplified AGC is divided by resistors 66 and 68 and a fixed proportion of the AGC voltage is applied to the multivibrator grid. As the signal strength increases and the AGC becomes more negative, diode 70 begins conducting and resistor 74 is placed in parallel with resistor 68, thus decreasing the slope of the AGC change at grid 53. An additional slope reducing point is selected and occurs when diode 72 conducts. With these slope changes, it is possible to maintain a loop gain of nearly one over the entire AGC range.

Obviously many modifications and variations of the present invention are possible in the light of the above teachings. It is therefore to be understood that within the scope of the appended claims the invention may be practiced otherwise than as specifically described.

What is claimed is:

1. An automatic gain control circuit for a pulse energy receiver comprising:

(a) an input terminal for receiving pulsed energy,
(b) electrical energy storage means,
(c) normally non-conducting circuit means coupling said input terminal to said energy storage means,
(d) monostable multivibrator circuit means coupled to said normally non-conducting circuit means and to said energy storage means for controlling the length of time said normally non-conducting circuit is non-conducting,
(e) gate circuit means coupled to said normally non-conducting circuit means for making said circuit conducting for an interval of time so that a finite amount of energy is conducted to said electrical energy storage means,
(f) circuit means coupling said electrical storage means to said gate circuit means for controlling the time interval said normally non-conducting circuit will be conducting.

2. An automatic gain control circuit for a pulse energy receiver comprising:

(a) a storage device,
(b) a charging circuit connected in series with said storage device including a normally non-conducting switching circuit,
(c) a variable width periodic pulse generating means coupled to said charging circuit for turning on said normally non-conducting switching circuit and allowing a charge to flow to said storage device,
(d) and feedback circuit means connecting said charge storage means to said periodic pulse generating means for controlling the width of the pulse supplied to said switching circuit.

3. The circuit of claim 2 wherein said feedback circuit includes a signal shaping network comprising:

(a) first and second rectifiers having their cathodes connected to said input signal and to said periodic pulse generating means,
(b) the cathode of said first and second rectifiers being connected across a resistor bridge network,
(c) and a voltage bias source connected to said bridge network whereby the rate of change of the output of said charge storage means is reduced to provide a loop gain of one.

References Cited

Bartz, M. R. et al.: "Instantaneous Analog Storage Circuit," IBM TDB vol. 7, No. 2, pp. 124, 125, July 1964.

BERNARD KONICK, *Primary Examiner.*

J. F. BREIMAYER, *Assistant Examiner.*